US010978496B2

(12) United States Patent
Yu et al.

(10) Patent No.: US 10,978,496 B2
(45) Date of Patent: Apr. 13, 2021

(54) PIXEL ARRAY SUBSTRATE AND DRIVING METHOD THEREOF

(71) Applicant: Au Optronics Corporation, Hsinchu (TW)

(72) Inventors: Fang-Cheng Yu, Taipei (TW); Chen-Chang Chen, Kaohsiung (TW); Tzu-Yi Tsao, Taipei (TW); Pin-Miao Liu, Hsinchu County (TW); Cheng-Yeh Tsai, Taipei (TW)

(73) Assignee: Au Optronics Corporation, Hsinchu (TW)

( * ) Notice: Subject to any disclaimer, the term of this patent is extended or adjusted under 35 U.S.C. 154(b) by 0 days.

(21) Appl. No.: 16/407,204

(22) Filed: May 9, 2019

(65) Prior Publication Data

US 2019/0348440 A1 Nov. 14, 2019

(30) Foreign Application Priority Data

May 10, 2018 (TW) .................................. 107115997

(51) Int. Cl.
*G09G 3/36* (2006.01)
*H01L 27/12* (2006.01)
*G02F 1/1362* (2006.01)
*H01L 27/15* (2006.01)

(52) U.S. Cl.
CPC .......... *H01L 27/124* (2013.01); *G02F 1/1362* (2013.01); *G09G 3/3648* (2013.01); *H01L 27/156* (2013.01)

(58) Field of Classification Search
USPC ..... 345/87, 690, 694, 691, 692, 43, 83, 204, 345/212; 257/40, 43; 438/10, 694
See application file for complete search history.

(56) References Cited

U.S. PATENT DOCUMENTS

| 7,061,555 B2 | 6/2006 | Wu et al. |
| 8,786,811 B2 | 7/2014 | Kubota et al. |
| 9,261,739 B2 | 2/2016 | Hiratsuka et al. |

(Continued)

FOREIGN PATENT DOCUMENTS

| CN | 104155802 | 11/2014 |
| CN | 101608743 | 4/2015 |

(Continued)

*Primary Examiner* — Thuy N Pardo
(74) *Attorney, Agent, or Firm* — JCIPRNET

(57) ABSTRACT

A pixel array substrate and a driving method of a pixel array substrate are provided. The pixel array substrate includes a substrate, at least one pixel structure located on the substrate and a liquid crystal layer. The at least one pixel structure includes a micro light emitting diode (μLED), a supporting wall, a first bottom electrode located between the supporting wall and the μLED, and a first top electrode disposed on the supporting wall and separated from the first bottom electrode. The μLED includes a first electrode, a first semiconductor layer electrically connected to the first electrode, a second semiconductor layer, a light-emitting layer located between the first semiconductor layer and the second semiconductor layer, and a second electrode electrically connected to the second semiconductor layer. The liquid crystal layer is disposed on the first bottom electrode and located between the supporting wall and the μLED.

18 Claims, 6 Drawing Sheets

(56) References Cited

U.S. PATENT DOCUMENTS

| | | | |
|---|---|---|---|
| 9,666,649 B2 | 5/2017 | Choi et al. | |
| 9,786,225 B2* | 10/2017 | Hyeon | G09G 3/3233 345/87 |
| 10,141,382 B2 | 11/2018 | Choi et al. | |
| 10,141,475 B1* | 11/2018 | Chen | H01L 33/0095 345/690 |
| 10,193,023 B2 | 1/2019 | Wu et al. | |
| 2004/0125271 A1 | 7/2004 | Wu et al. | |
| 2010/0277516 A1* | 11/2010 | Kimura | G09G 3/2029 345/690 |
| 2011/0207328 A1* | 8/2011 | Speakman | H01L 51/0016 438/694 |
| 2014/0091993 A1* | 4/2014 | Lau | G09G 3/32 345/83 |
| 2014/0104243 A1* | 4/2014 | Sakariya | G06F 3/14 345/204 |
| 2014/0368561 A1* | 12/2014 | Liao | G09G 3/2014 345/692 |
| 2015/0194474 A1 | 7/2015 | Choi et al. | |
| 2015/0221671 A1 | 8/2015 | Voutsas | |
| 2015/0332635 A1* | 11/2015 | Lau | G09G 3/3413 345/691 |
| 2016/0063924 A1* | 3/2016 | Oh | H01L 27/1251 345/690 |
| 2016/0064465 A1* | 3/2016 | Oh | H01L 27/1251 257/43 |
| 2016/0071456 A1* | 3/2016 | Ota | G09G 3/3225 345/691 |
| 2016/0118420 A1* | 4/2016 | Yang | H01L 27/124 257/40 |
| 2016/0180767 A1* | 6/2016 | Sakariya | G09G 3/3233 345/212 |
| 2016/0359089 A1* | 12/2016 | Moon | H01L 33/507 345/87 |
| 2017/0237009 A1* | 8/2017 | Kwak | H01L 27/1259 438/10 |
| 2017/0237041 A1 | 8/2017 | Choi et al. | |
| 2018/0069149 A1* | 3/2018 | Zou | H01L 27/15 345/87 |
| 2018/0166609 A1 | 6/2018 | Wu et al. | |
| 2019/0043910 A1* | 2/2019 | Miyazawa | H01L 27/14627 345/87 |
| 2020/0044155 A1* | 2/2020 | Kwak | H01L 27/3276 345/87 |
| 2020/0144349 A1* | 5/2020 | Lee | H01L 27/3216 345/87 |

FOREIGN PATENT DOCUMENTS

| | | |
|---|---|---|
| CN | 104766928 | 7/2015 |
| TW | I230305 | 4/2005 |
| TW | I622188 | 4/2018 |

* cited by examiner

PIXEL ARRAY SUBSTRATE AND DRIVING METHOD THEREOF

CROSS-REFERENCE TO RELATED APPLICATION

This application claims the priority benefit of Taiwan application serial no. 107115997, filed on May 10, 2018. The entirety of the above-mentioned patent application is hereby incorporated by reference herein and made a part of this specification.

BACKGROUND

1. Field of the Invention

This disclosure is related to a substrate and a driving method of the substrate, especially related to a pixel array substrate and a driving method of the pixel array substrate.

2. Description of Related Art

A light emitting diode (LED) is a light emitting device, which is suitable for constructing a light emitting diode display panel because of its low power consumption, high brightness, high resolution, and high color saturation and the like. The micro light-emitting diodes (μLED) not only inherit the characteristics of the LEDs, but also reduce the volume of the pixel structure using the μLEDs to 1% of the volume of the pixel structure using the LEDs of a display panel.

However, the electrode pads of the μLEDs block the light emitted by the μLEDs, resulting in the problem of reduced light extraction efficiency of the micro light-emitting diodes and seriously affecting the quality of the display panel. Therefore, there is a need for a method that can increase the light extraction efficiency of a micro light-emitting diode.

SUMMARY

The present invention provides a pixel array substrate capable of solving the problem of low light extraction efficiency of the micro light-emitting diode or adjusting the light emitting angle.

The present invention provides a method for driving a pixel array substrate, which can solve the problem of low light extraction efficiency of the micro light-emitting diodes or adjusting the light emitting angle.

A pixel array substrate of the present invention includes a substrate, at least one pixel structure on the substrate, and a liquid crystal layer. The at least one pixel structure includes a micro light emitting diode, a supporting wall disposed on the substrate, a first bottom electrode disposed on the substrate and between the supporting wall and the micro light emitting diode, and a first top electrode disposed on the supporting wall and separated from the first bottom electrode. The micro light emitting diode includes a first electrode, a first semiconductor layer electrically connected to the first electrode, a second semiconductor layer at least partially overlapping with the first semiconductor layer, a light emitting layer located between the first semiconductor layer and the second semiconductor layer, and a second electrode electrically connected to the second semiconductor layer. The liquid crystal layer is disposed on the first bottom electrode and is located between the supporting wall and the micro light emitting diode.

A driving method for a pixel array substrate of the present invention includes providing a pixel array substrate first, wherein the pixel array substrate includes a substrate, at least one pixel structure disposed on the substrate, and a liquid crystal layer. The at least one pixel structure includes a micro light emitting diode, a first bottom electrode disposed on the substrate, a supporting wall disposed on at least two sides of the micro light emitting diode, and a first top electrode disposed on the supporting wall and separated from the first bottom electrode. The micro light emitting diode includes a first electrode, a first semiconductor layer electrically connected to the first electrode, a second semiconductor layer at least partially overlapping with the first semiconductor layer, and a light emitting layer located between the first semiconductor layer and the second semiconductor layer, and a second electrode electrically connected to the second semiconductor layer. The liquid crystal layer is disposed on the first bottom electrode and is located between the supporting wall and the micro light emitting diode. Then, a first voltage is applied to the first electrode, a second voltage is applied to the first bottom electrode, a third voltage is applied to the second electrode, and a fourth voltage is applied to the first top electrode. The first voltage is different from the third voltage, and the second voltage is different from the fourth voltage.

Based on the above, the pixel array substrate and the driving method thereof according to the present invention can improve the problem of low light extraction efficiency of the pixel structure, or adjust the light emitting angle, and can further improve the display quality of the display panel.

In order that the above features and advantages of the present invention can be more clearly understood, the following embodiments are described in detail and in conjunction with the accompanying drawings as described in detail below.

DESCRIPTION OF THE EMBODIMENTS

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

Unless otherwise defined, all terms (including technical and scientific terms) used herein have the same meaning as commonly understood by one of ordinary skill in the art to which this invention belongs. It will be further understood that terms such as those defined in commonly used dictionaries should be interpreted as having a meaning that is consistent with their meaning in the context of the related art and the present invention and will not be interpreted as idealized or excessive. The formal meaning, unless explicitly defined in this article.

Exemplary embodiments are described herein with reference to cross-section illustrations that are schematic illustrations of idealized embodiments. Thus, variations in the shapes of the illustrations as a result, for example, of manufacturing techniques and/or tolerances are contemplated. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. In addition, the acute angle shown can be round. Thus, the regions illustrated in the figures are schematic in nature and their shapes are not intended to illustrate the precise shape of a region and are not intended to limit the scope of the claims.

Figure 1:
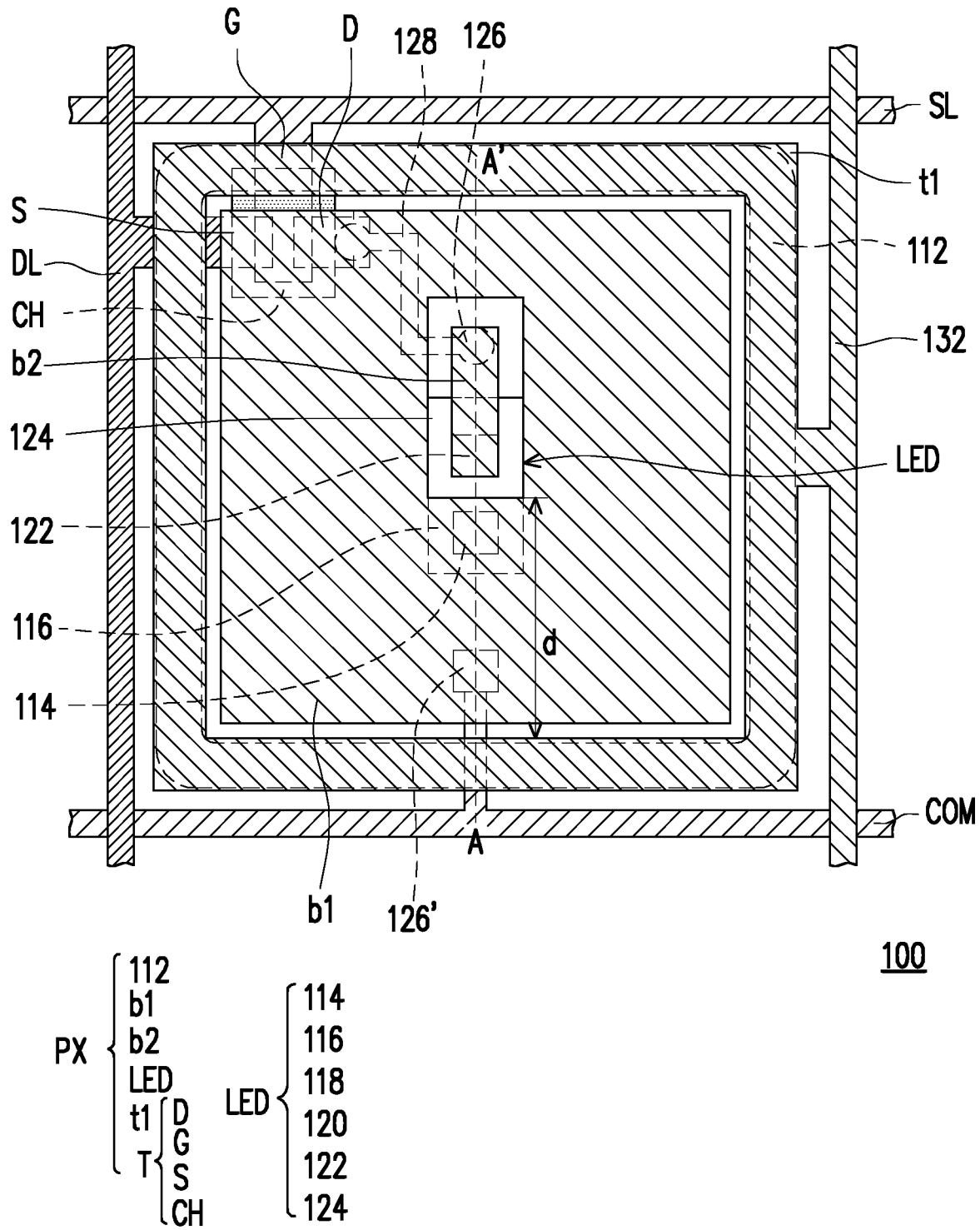
FIG. 1 is a schematic top view of a pixel array substrate according to an embodiment of the present invention.
Figure 2:
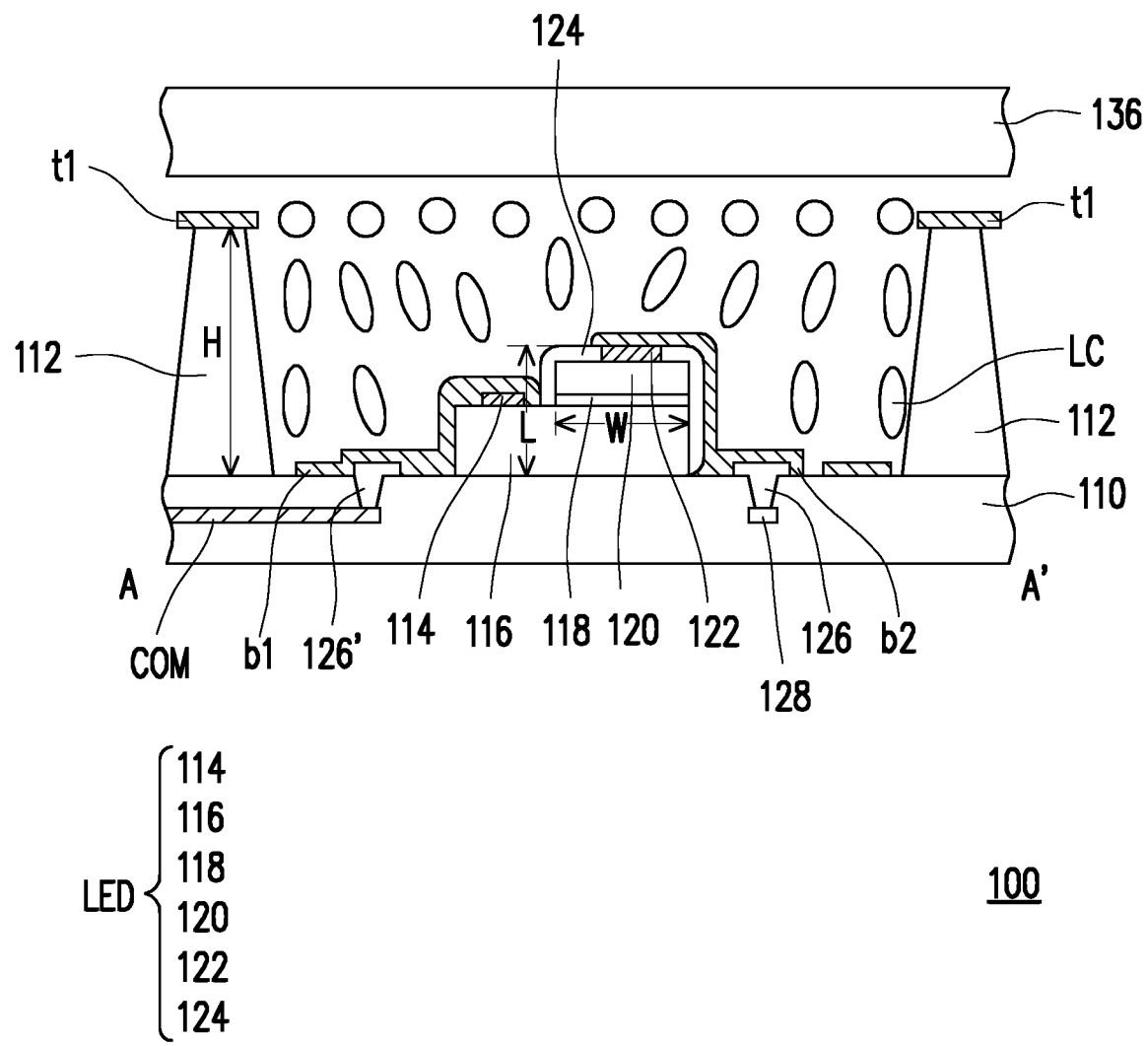
FIG. 2 is a schematic cross-sectional view of a pixel array substrate according to a section line A-A' of FIG. 1.

FIG. 1 is a schematic top view of a pixel array substrate according to an embodiment of the present invention. FIG. 2 is a schematic cross-sectional view of a pixel array substrate according to a section line A-A' of FIG. 1.

Please refer to FIG. 1 and FIG. 2. The pixel array substrate 100 of the present embodiment includes a substrate 110, a pixel array, and a liquid crystal layer LC. The material of the substrate 110 may be glass, quartz, organic polymer, metal, or other applicable materials. The substrate 110 includes a pixel array disposed thereon. The pixel array includes a plurality of scan lines SL, a plurality of data lines DL, a plurality of first signal lines 132, at least one pixel structure PX, and a common electrode line COM. For the convenience of description, only a scan line SL, a data line DL, a first signal line 132, a pixel structure PX, and a common electrode line COM are exemplified. The scan line SL and the data line DL are interleaved with each other, and each pixel structure is electrically connected to one corresponding scan line SL and one corresponding data line DL. In the embodiment of the present invention, the extension direction of the scan line SL is not parallel to the extension direction of the data line DL. For example, the extending direction of the scan line SL and the extending direction of the data line DL are perpendicular to each other. The scan line SL and the data line DL are generally made of a metal material. However, the present invention is not limited thereto. According to other embodiments, the scan line SL and the data line DL may also use other conductive materials (such as a metal nitride material, a metal oxide material, a metal oxynitride material, or other suitable material), or a stacked layer of a metal material and other conductive materials. FIG. 2 also illustrates an opposite substrate 136 disposed on the opposite side of the pixel array substrate 100. For example, a color filter pattern, a wavelength conversion material, or other components may be included on the opposite substrate 136.

Please refer to FIG. 1 and FIG. 2, at least one pixel structure PX is located on the substrate 110. The pixel structure PX includes an active device T, a micro light emitting diode LED, a supporting wall 112, a first bottom electrode b1, a second bottom electrode b2, and a first top electrode t1. The active device T may be a bottom gate type thin film transistor or a top gate type thin film transistor including a gate G, a source S, a drain D, and a channel CH.

The gate G of the active device T is electrically connected to one of the scan lines SL, the source S of the active device T is electrically connected to one of the data lines DL, and the drain D of the active device T is electrically connected to one end of a micro light emitting diode LED. In some embodiments, the active device T is electrically connected with the micro light emitting diode LED by other driving elements, but the invention is not limited thereto.

Please continuously refer to FIG. 1. In this embodiment, the common electrode line COM includes a main line extending in a direction parallel to the extending direction of the scan line SL and a branch extending from the main line toward the pixel structure PX. The branch of the common electrode line COM is electrically connected to a electrode pad 126'. The common electrode line COM may be a transparent conductive pattern. The material may be a metal oxide such as indium tin oxide, indium zinc oxide, aluminum tin oxide, aluminum zinc oxide, indium gallium zinc oxide, other suitable oxides, or a stacked layer of at least two of the oxides above. The material of the common electrode line COM may also be a highly reflective conductive material such as a metal, an alloy, a metal nitride, a metal oxide, a metal oxynitride, or a stacked layer of metal and other conductive materials. In this embodiment, the common electrode lines COM may be made of the same material or the same process as the scan lines SL, for example, but the invention is not limited thereto.

With continued reference to FIGS. 1 and 2, the micro light emitting diode LED includes a first electrode 114, a first semiconductor layer 116, a light emitting layer 118, a second semiconductor layer 120, a second electrode 122, and an insulating layer 124. In this embodiment, the insulating layer 124 has at least two openings exposing a portion of the top surface of the first semiconductor layer 116 and a portion of the top surface of the second semiconductor layer 120. In this embodiment, the first electrode 114 and the second electrode 122 are respectively disposed in openings of the insulating layer 124 exposing the first semiconductor layer 116 and the second semiconductor layer 120. The first electrode 114 may also be in contact with the first semiconductor layer 116 indirectly through another conductive film layer, and the second electrode 122 may also be in contact with the second semiconductor layer 120 indirectly through the other conductive film layer. The first electrode 114 is electrically connected to the first semiconductor layer 116, and the second electrode 122 is electrically connected to the second semiconductor layer 120. In the present embodiment, the second semiconductor layer 120 overlaps a portion of the first semiconductor layer 116. One of the first semiconductor layer 116 and the second semiconductor layer 120 is an N-type doped semiconductor, and the other is a P-type doped semiconductor. The materials of the first semiconductor layer 116 and the second semiconductor layer 120 include, for example, materials composed of gallium nitride (GaN), indium gallium nitride (InGaN), gallium arsenide (GaAs), or other material composed by IIIA group elements and VA group elements, or other suitable materials, but the invention is not limited thereto.

The light emitting layer 118 is located between the first semiconductor layer 116 and the second semiconductor layer 120. The light-emitting layer 118 has, for example, a quantum well (QW). The light-emitting layer 118 is, for example, a single quantum well (SQW), a multi-quantum well (MQW), or other quantum wells. Holes provided by the P-type doped semiconductor layer and electrons provided by the N-type doped semiconductor layer may be combined in the light-emitting layer 118 and emit energy in the form of light. In some embodiments, the material of the light emitting layer 118 includes, for example, gallium nitride (GaN), indium gallium nitride (InGaN), gallium arsenide (GaAs), aluminum gallium indium phosphide (AlGaInP), indium aluminum arsenide (InAlGaAs) or other material composed by Group IIIA elements and VA Group elements or other suitable materials. The width of the light emitting layer 118 is W, and W is between 5 µm and 50 µm, for example. In the present embodiment, although the micro light emitting diode LED takes a horizontal micro light emitting diode as an example, the present invention is not limited thereto. In other embodiments, the micro light emitting diode LED may also be a vertical micro light emitting diode or other types of micro light emitting diodes.

Please refer to FIG. 1 and FIG. 2. The supporting wall 112 is disposed on the substrate 110, and the first top electrode t1 is disposed on the supporting wall 112. In this embodiment, the supporting wall 112 and the first top electrode t1 completely surround the four sides of the micro light emitting diode LED. However, the present invention is not limited thereto. The supporting wall 112 and the first top electrode t1 may also partly surround the four sides of the micro light emitting diode LED. The pattern of the supporting wall 112 and the first top electrode t1 vertically projected onto the substrate 110 may be a hollow circle, ellipse, square, rectangle, diamond, hexagon, or polygon. There is a shortest distance d between one side of a pattern of the light emitting layer 118 of the micro light emitting diode LED vertically projected onto the substrate 110 and a pattern of the first top electrode t1 vertically projected onto the substrate 110. The shortest distance d is greater than W and less than 5 times of W, such as between 15 and 250 microns. When considering the light extraction efficiency or the effect of adjusting the light emitting angle, the height H of the supporting wall 112 is more than twice the height L of the micro light emitting diode LED, and the preferred height ratio H/L is at least 3. For example, the height L of the micro light-emitting diode LED is 2 µm to 10 µm, and the height H of the supporting wall 112 is 6 µm to 30 µm. The first top electrode t1 is electrically connected to the first signal line 132. The first signal line 132, for example, serially connects a plurality of the first top electrodes t1. The first bottom electrode b1 is disposed on the substrate 110 and is located between the supporting wall 112 and the micro light-emitting diode LED. The first bottom electrode b1 is separated from the first top electrode t1. The first bottom electrode b1 electrically connects the first electrode 114 to the electrode pad 126'. The first bottom electrode b1 is separated from the second bottom electrode b2. The second bottom electrode b2 is disposed on the substrate 110 and is electrically connected to the second electrode 122. The second bottom electrode b2 is electrically connected to the drain D of the active device T through the electrode pad 126 and the connection structure 128.

In some embodiments, the micro light emitting diode LED is formed on a growth substrate and then transferred from the growth substrate to the substrate 110. In some embodiments, the substrate 110 has an adhesive layer (not shown) thereon, and the adhesive layer helps to fix the micro light emitting diode LED on the substrate 110. After the micro light emitting diode LED is transferred onto the substrate 110, the first bottom electrode b1 and the second bottom electrode b2 are then formed to electrically connect the micro light emitting diode LED to the electrode pad 126 and the electrode pad 126'.

In some embodiments, the first bottom electrode b1, the second bottom electrode b2, and the first top electrode t1 are formed in the same process, such as a chemical vapor deposition process, and can be formed by the same mask to deposit the desired shape. In some embodiments, since the supporting wall 112 has a height H, the deposited first top electrode t1 and the first bottom electrode b1 can be separated from each other without short circuit. In an embodiment, in addition to the top surface of the supporting wall 112, the first top electrode t1 also can be formed on a portion of a side surface of the supporting wall 112, which is near the top surface of the supporting wall 112, but does not completely cover the side surface of the supporting wall 112. The distance between the first top electrode t1 and the substrate 110 is preferably greater than at least 2/3H. In this design, the problem of short circuit caused by the process is less likely to occur, and the effect of the electric field distribution generated by the first top electrode t1 and the first bottom electrode b1 is decreased and the control capability is better.

In the present embodiment, the material of the first bottom electrode b1, the second bottom electrode b2, and the first top electrode t1 may include a metal material, a metal oxide, or other suitable material. The metal material includes, for example, copper, steel, and copper, tungsten alloys, copper-silver alloys, or other suitable metals. The metal oxide includes, for example, indium tin oxide, indium zinc oxide, aluminum tin oxide, aluminum zinc oxide, indium gallium zinc oxide, other suitable oxides, or a stacked layer of at least two of the metal oxides above. In the present embodiment, the materials of the first bottom electrode b1, the second bottom electrode b2, and the first top electrode t1 are the same, but the present invention is not limited thereto. In other embodiments, the materials of the first bottom electrode b1, the second bottom electrode b2, and the first top electrode t1 may not be the same.

Please refer to FIG. 2. The liquid crystal layer LC is disposed on the first bottom electrode b1, and a part of the liquid crystal layer LC is located between the supporting wall 112 and the micro light emitting diode LED, and a part of the liquid crystal layer LC above the micro light emitting diode LED. The liquid crystal layer LC includes liquid crystal molecules or other applicable media. In the following embodiments of the present invention, the material of the liquid crystal layer LC is preferably blue-phase liquid crystal molecules, but the present invention is not limited thereto. The refractive index of the liquid crystal molecules in the liquid crystal layer LC is between 1.7 and 2.4. When no electric field is applied, the liquid crystal molecules in the liquid crystal layer LC is optically isotropic. The method for driving the pixel array substrate 100 includes first providing the pixel array substrate 100, and then applying a first voltage V1 to the first electrode 114, a second voltage V2 to the first bottom electrode b1, a third voltage V3 to the second electrode 122, and a fourth voltage V4 to the first top electrode t1. In this embodiment, the first voltage V1 is equal to the second voltage V2, the first voltage V1 is different from the third voltage V3, and the second voltage V2 is different from the fourth voltage V4. When an electric field is applied, the liquid crystal molecules in the liquid crystal layer LC may rotate or change the structure as the blue phase liquid crystal molecules do, and the direction of the light emitted by the micro light emitting diode LED is thus changed to concentrate light or adjust the emitted light. The change in the refractive index of the liquid crystal molecules can be changed by adjusting the fourth voltage V4, for example. In this embodiment, by changing the liquid crystal molecules in the liquid crystal layer LC, the light emitting angle of the pixel structure can be increased, and the problem of the reduced light extraction efficiency of the pixel structure can be solved, or the light emitting angle can be adjusted.

Based on the above, the pixel array substrate 100 and the driving method thereof of the present invention can increase the light emitting angle of the pixel structure and solve the problem of reduced light extraction efficiency of the pixel structure, or adjust the light emitting angle to further improve the image quality of the display panel.

Figure 3:
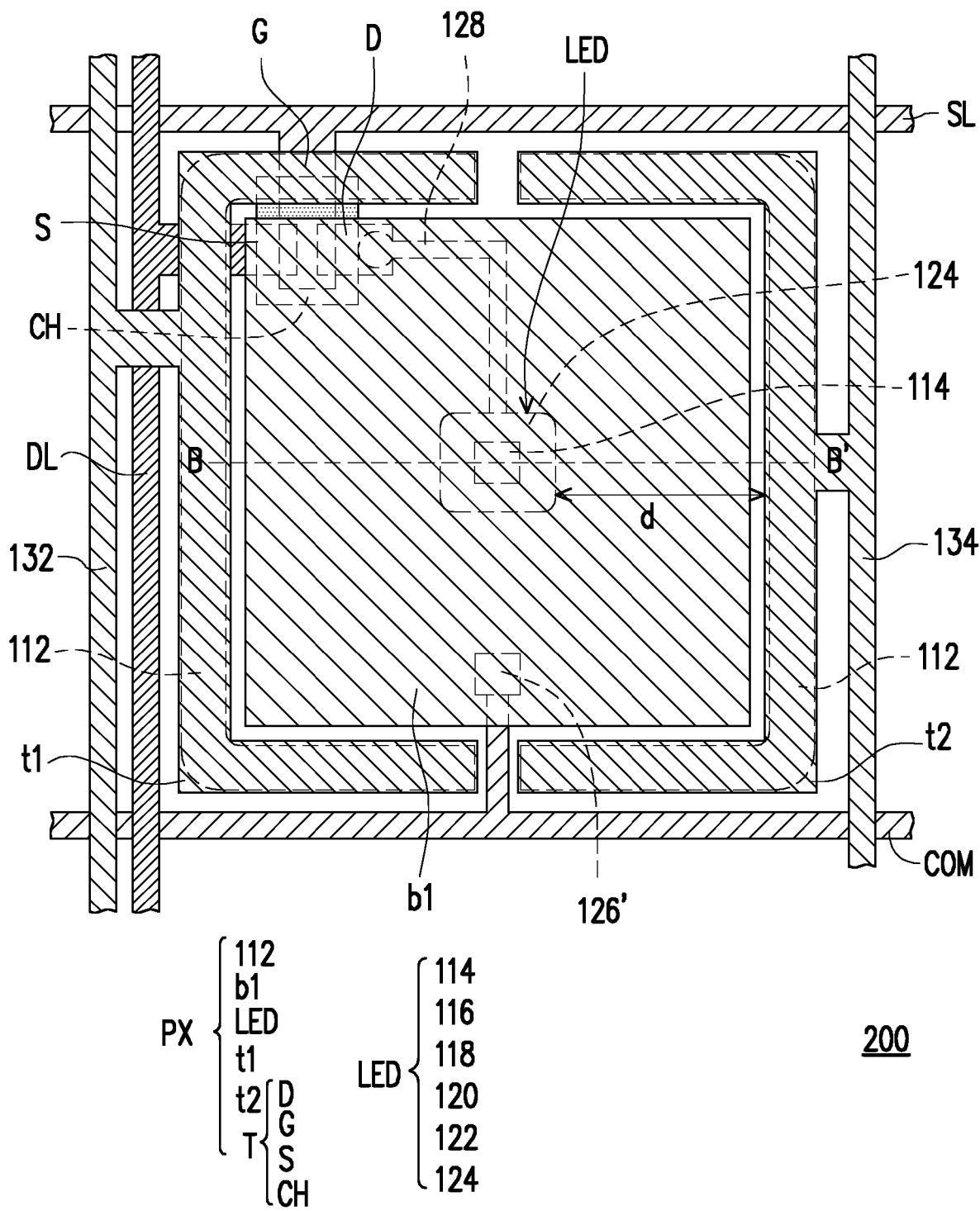
FIG. 3 is a schematic top view of a pixel array substrate according to another embodiment of the present invention.
Figure 4:
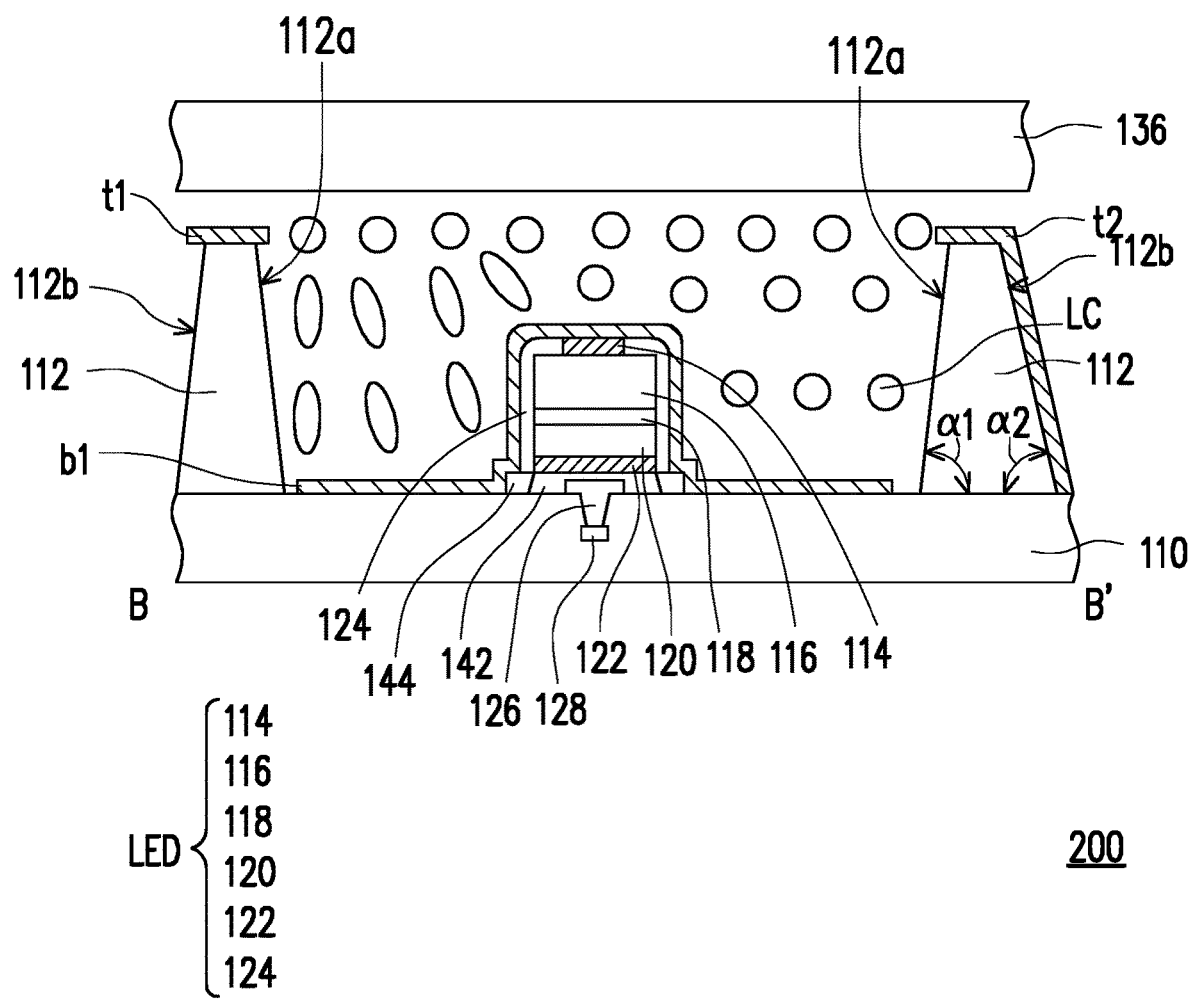
FIG. 4 is a schematic cross-sectional view of a pixel array substrate according to a section line B-B' of FIG. 3.

FIG. 3 is a schematic top view of a pixel array substrate according to another embodiment of the present invention. FIG. 4 is a schematic cross-sectional view of a pixel array substrate according to a section line B-B' of FIG. 3. It must be explained here that the embodiment of FIGS. 3 and 4 follows the reference numerals and partial contents of the components of the embodiment of FIGS. 1 and 2. The same or similar reference numerals are used to denote the same or similar components, and the illustrations of the technical content of the same components are omitted. For the description of the omitted parts, reference may be made to the foregoing embodiment, and will not be repeated in the following embodiments.

The difference between the embodiment of FIG. 4 and the embodiment of FIG. 2 is that the pixel array substrate 200 further includes a second top electrode t2 and a second signal line 134.

Referring to FIGS. 3 and 4, in the pixel array substrate 200 of the present embodiment, at least one pixel structure PX includes an active device T, a micro light emitting diode LED, a supporting wall 112, a first bottom electrode b1, a first top electrode t1, and a second top electrode t2. In this embodiment, the supporting wall 112 includes two parts separated from each other, and the second top electrode t2 is disposed on a part of the supporting wall 112 and is separated from the first top electrode t1 located on the other part of the supporting wall 112. The second top electrode t2 is electrically connected to the second signal line 134. The second signal line 134 has the same extension direction as the first signal line 132, but is disposed on the opposite sides of the pixel structure PX, respectively. The supporting wall 112 has a first side 112a facing the micro light emitting diode LED and a second side 112b opposite to the first side 112a. The angle between the first side 112a of the supporting wall 112 and the substrate 110 is α1 and the angle between the second side 112b of the supporting wall 112 and the substrate 110 is α2, and α1 is greater than α2. Since α1 is greater than α2, the first top electrode t1 and the second top electrode t2 on the supporting wall 112 may be deposited on the flatter portion of the second side 112b of the supporting wall 112. The first top electrode t1 and the second top electrode t2 can be more easily to electrically connect to the first signal line 132 and the second signal line 134 respectively through the flatter portion of the second side 112b of the supporting wall 112. Therefore, the breaking problem caused by that the height of supporting wall 112 is too high can be decreased when the first top electrode t1 and the second top electrode t2 are electrically connected to the first signal line 132 and the second signal line 134.

In the present embodiment, the supporting wall 112 and the first top electrode t1, or the supporting wall 112 and the second top electrode t2 are partially surrounded by the four sides of the micro light emitting diode LED chip, but the present invention is not limited thereto.

Please refer to FIGS. 3 and 4. In this embodiment, the micro light emitting diode LED is, for example, bonded (electrically connected) to the electrode pad 126 on the substrate 110 through the solder 142, and an insulating layer 144 is disposed around the solder 142, for example, but the invention is not limited thereto. The second electrode 122 of the micro light emitting diode LED is electrically connected to the drain D of the active device T through the electrode pad 126 and the connection structure 128. The second electrode 122 is electrically connected to the second semiconductor layer 120. In the present embodiment, the insulating layer 124 of the micro light emitting diode LED has at least one opening to expose a portion of the top surface of the first semiconductor layer 116. The first electrode 114 is disposed in the opening of the insulating layer 124 exposing the first semiconductor layer 116, and the first electrode 114 is electrically connected to the first semiconductor layer 116. In the present embodiment, the second semiconductor layer 120 overlaps with the first semiconductor layer 116. Although in the present embodiment, the micro light emitting diode LED takes a vertical micro light emitting diode as an example, the invention is not limited thereto. In other embodiments, the micro light emitting diode LED may also be a horizontal micro light emitting diode or other type of micro light emitting diode.

The method for driving the pixel array substrate 200 includes first providing the pixel array substrate 200, then applying a first voltage V1 to the first electrode 114, a second voltage V2 to the first bottom electrode b1, a third voltage V3 to the second electrode 122, a fourth voltage V4 to the first top electrode t1, and a fifth voltage V5 to the second top electrode t2. The first voltage V1 is equal to the second voltage V2, the first voltage V1 is different from the third voltage V3, the second voltage V2 is different from the fourth voltage V4, the second voltage V2 is different from the fifth voltage V5, and the fifth voltage V5 is different from the fourth voltage V4. For example, the first electrode 114 is electrically connected to the first bottom electrode b1. When an electric field is applied, the liquid crystal molecules in the liquid crystal layer LC may rotate or change the refractive index due to deformation, and change the traveling direction of the light emitted by the micro light emitting diode LED to further concentrate or disperse the light. The change in the refractive index of the liquid crystal molecules can be changed by, for example, adjusting the fourth voltage V4 and the fifth voltage V5. In the present embodiment, by virtue of the fifth voltage V5 being different from the fourth voltage V4, the liquid crystal molecules between the micro light emitting diode LED and the supporting walls 112 on both sides can feel different electric field strengths to make the rotation angle or the degree of deformation of the liquid crystal molecules on the two sides of the light emitting diode LED to be different, so that the viewing angle can be partially adjusted to display an image in a specific direction or achieve a partial anti-peep effect and privacy protection. For example, in the present embodiment, the central viewing angle luminance and the overall luminance of the pixel array substrate 200 using the liquid crystal layer LC composed of a blue phase liquid crystal having a high refractive index (e.g., a refractive index of 1.8) is higher than the average pixel array substrate, when an electric field is applied or not applied. In this embodiment, the liquid crystal layer LC can also be positioned between the supporting wall 112 and the micro light emitting diode LED and has a birefringence characteristic, so that the light emitting angle of the pixel structure can be increased and the problem of reduced light extraction efficiency of pixel structure can be solved.

Based on the above, the pixel array substrate 200 and the driving method thereof of the present invention can increase the light emitting angle of the pixel structure and solve the problem of low light extraction efficiency of the pixel structure, or adjust the light emitting angle to further improve the display quality of the display panel.

Figure 5:
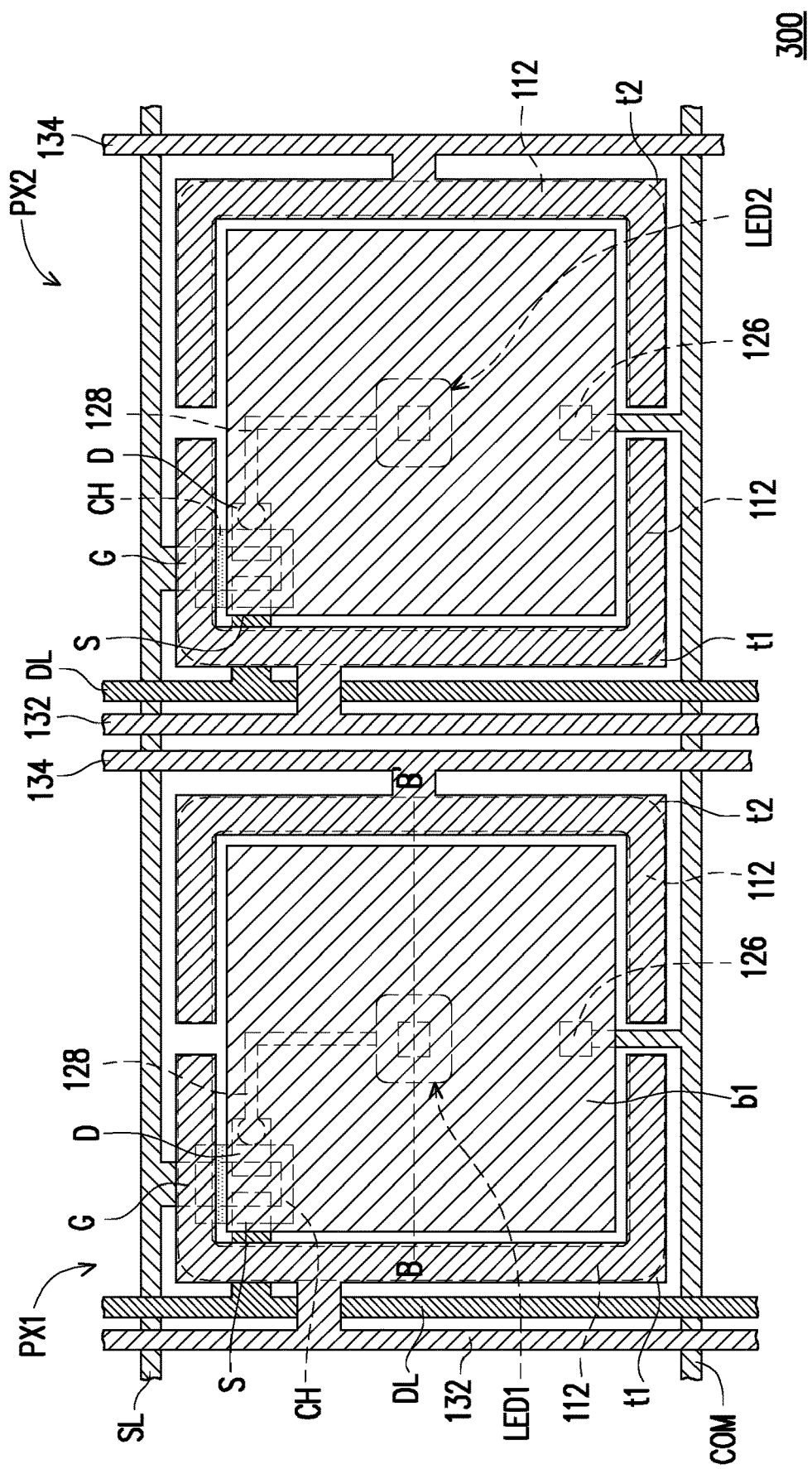
FIG. 5 is a schematic top view of a pixel array substrate according to another embodiment of the present invention.

FIG. 5 is a schematic top view of a pixel array substrate according to another embodiment of the present invention. It must be noted here that the embodiment of FIG. 5 follows the reference numerals and partial contents of the embodiment of FIG. 3, wherein the same or similar components are denoted by the same or similar reference numerals, and the description of the same technical content is omitted. For the description of the omitted parts, reference may be made to the foregoing embodiments and will not be repeated in the following embodiments.

The embodiment of FIG. 5 is a schematic top view of a plurality of pixel structures in the embodiment of FIG. 3 arranged. Referring to FIG. 5, in this embodiment, the pixel array substrate 300 includes two pixel structures PX1 and PX2. The supporting walls 112 of the two pixel structures PX1, PX2 are separated from each other, and the first top electrode t1 of the pixel structures PX2 is adjacent to the second top electrode t2 of the pixel structure PX1. In the present embodiment, the micro light emitting diodes LED1 and LED2 in the two pixel structures PX1 and PX2 can emit light of different colors. For example, the micro light emitting diode LED1 and the micro light emitting diode LED2 can emit different colors of light. In some embodiments, the liquid crystal layers corresponding to different micro light emitting diodes comprises liquid crystal molecules of different refractive index, or the individual viewing angles of the different micro light emitting diodes may be adjusted through the applied voltage. For example, one of the pixel structures PX2 emits blue light and uses a liquid crystal layer composed of liquid crystal molecules having a refractive index of 1.7, and the other pixel structure PX1 emits red light and uses a liquid crystal layer composed of liquid crystal molecules having a refractive index of 2.2. In this embodiment, using different micro light emitting diodes and liquid crystal layers composed of different refractive index liquid crystal molecules can increase the light emitting angle of the pixel structure and solve the problem of low light extraction efficiency of the pixel structure. In some embodiments, different refractive index liquid crystal molecules are formed, for example, by ink jet printing.

The method for driving the pixel array substrate 300 includes applying a first voltage V1 to the first electrode 114, a second voltage V2 to the first bottom electrode b1, a third voltage V3 to the second electrode 122, a fourth voltage V4 to the first top electrode t1, and a fifth voltage V5 to the second top electrode t2. The first voltage V1 is equal to the second voltage V2, the first voltage V1 is different from the third voltage V3, the second voltage V2 is different from the fourth voltage V4, the second voltage V2 is different from the fifth voltage V5, and the fifth voltage V5 is different from the fourth voltage V4. The first top electrode t1 of the pixel structure PX2 is applied with the same voltage as the second top electrode t2 of the other pixel structure PX1. In this embodiment, by applying the same voltage to the first top electrode t1 of the pixel structure PX2 and the second top electrode t2 of the other pixel structure PX1, the light leakage problem between adjacent two pixel structures PX1 and PX2 can be improved.

Based on the above, the pixel array substrate 300 and the method for driving the same according to the present invention can increase the light angle of the pixel structure and solve the problem of low light extraction efficiency of the pixel structure, or adjust the light output angle, and further improve the display quality of the display panel through the pixel structures PX1 and PX2 on the substrate 110 respectively including the micro light emitting diodes LED1 and LED2 as well as the liquid crystal layer LC between the supporting walls 112 and the micro light emitting diodes LED1 and LED2.

Figure 6:
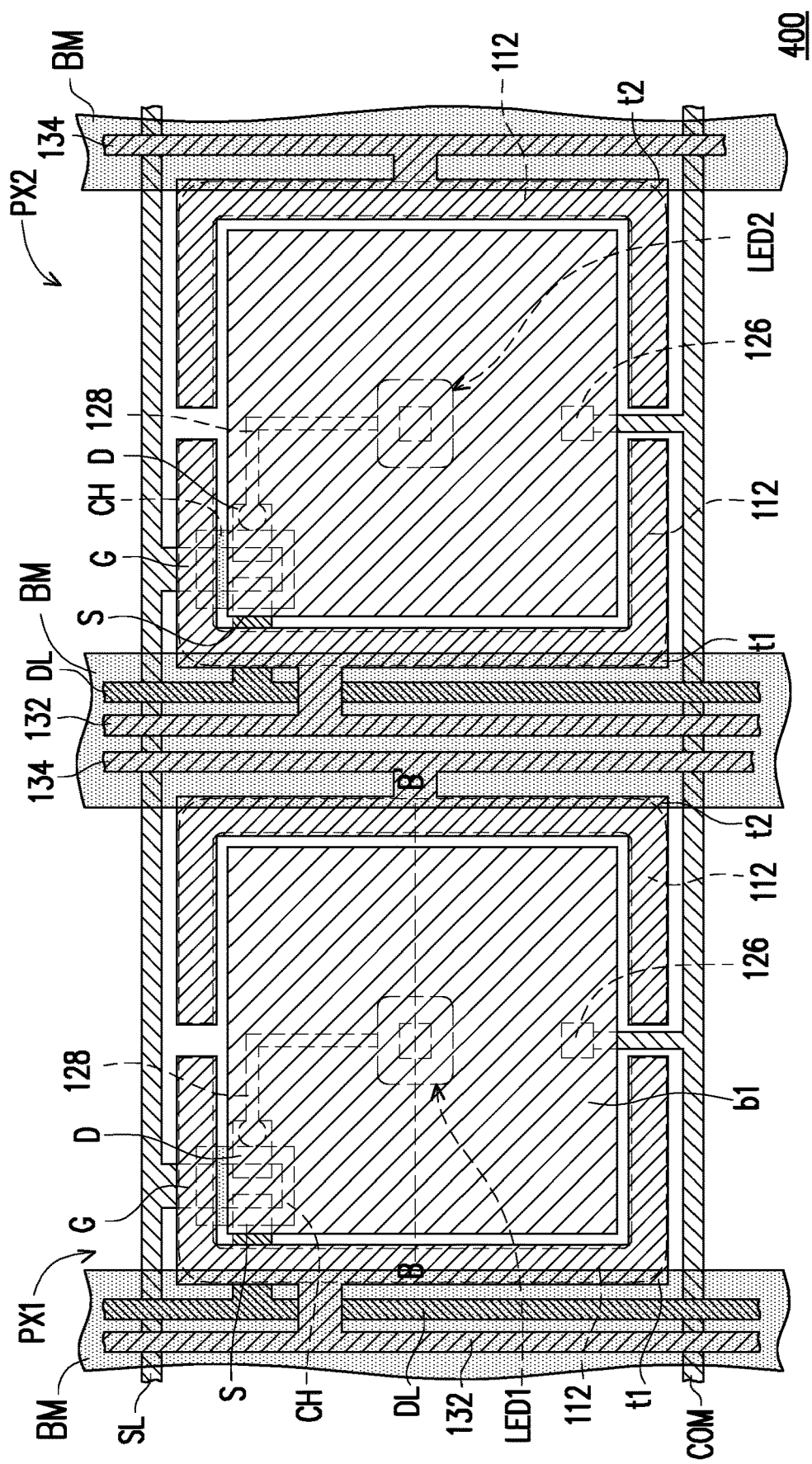
FIG. 6 is a schematic top view of a pixel array substrate according to another embodiment of the present invention.

FIG. 6 is a schematic top view of a pixel array substrate according to another embodiment of the present invention.

It must be noted here that the embodiment of FIG. 6 follows the reference numerals and partial contents of the embodiment of FIG. 5, wherein the same or similar components are denoted by the same or similar reference numerals, and the description of the same technical content is omitted. For the description of the omitted parts, reference may be made to the foregoing embodiments and will not be repeated in the following embodiments.

The difference between the embodiment of FIG. 6 and the embodiment of FIG. 5 is that the pixel array substrate 400 further includes a light shielding pattern BM.

Referring to FIG. 6, in the present embodiment, the pixel array substrate 400 includes two pixel structures PX1 and PX2. The supporting walls 112 of the two pixel structures PX1 and PX2 are separated from each other, and the first top electrode t1 of the pixel structures PX2 is adjacent to the second top electrode t2 of the other pixel structure PX1. In this embodiment, the pixel array substrate 400 further includes a light shielding pattern BM. The light-shielding pattern BM is located between any two adjacent pixel structures to shield each signal line therebetween. The light-shielding pattern BM may partially overlap on the first top electrode t1 of one pixel structure PX2 and on the second top electrode t2 of the other pixel structure PX1, but the present invention is not limited thereto. In other embodiments, it may not overlap with any top electrodes. The vertical projection of the light shielding pattern BM on the substrate 110 is located between the vertical projection of the first top electrode t1 of the pixel structure PX2 on the substrate 110 and the vertical projection of the second top electrode t2 of the other pixel structure PX1 on the substrate 110. In this embodiment, light leakage between adjacent two pixel structures can be improved by the configuration of the light shielding patterns BM.

Based on the above, the pixel array substrate and the driving method thereof of the present invention can increase the light emitting angle of the pixel structure and solve the problem of low light extraction efficiency of the pixel structure, or adjust the light emitting angle, and further improve the display quality of the display panel.

In summary, the pixel array substrate and the driving method thereof according to the present invention can increase the central viewing angle luminance, the overall luminance, and the local adjustment of viewing angle to display an image in a specific direction image or achieve a partial anti-peeping effect to improve the light leakage problem between adjacent two pixel structures through the pixel structures including the micro light emitting diodes on the substrate and the liquid crystal layer. The pixel array substrate and the driving method thereof of the present invention can increase the light emitting angle of the pixel structure and solve the problem of reduced light extraction efficiency of the pixel structure, or adjust the light emitting angle, and can further improve the display quality of the display panel.

Although the present invention has been disclosed by way of examples above, it is not intended to limit the present invention. Any person of ordinary skill in the art may make some changes and modifications without departing from the spirit and scope of the present invention. The scope of protection of the present invention shall be subject to the definition of the appended claims.

What is claimed is:
1. A pixel array substrate, comprising:
   a substrate;
   at least one pixel structure disposed on the substrate, wherein the at least one pixel structure comprises:

a micro light emitting diode, comprising:
a first electrode;
a first semiconductor layer electrically connected to the first electrode;
a second semiconductor layer, wherein at least a part of the second semiconductor layer overlaps the first semiconductor layer;
a light emitting layer disposed between the first semiconductor layer and the second semiconductor layer; and
a second electrode electrically connected to the second semiconductor layer;
a supporting wall disposed on the substrate;
a first bottom electrode disposed on the substrate and between the supporting wall and the micro light emitting diode; and
a first top electrode disposed on the supporting wall and separated from the first bottom electrode; and
a liquid crystal layer disposed on the first bottom electrode and between the supporting wall and the micro light emitting diode, wherein the width of the light emitting layer is W, a vertical projection of the light emitting layer on the substrate forms a pattern, and a shortest distance between one side of the pattern and a vertical projection of the first top electrode on the substrate is larger than W and smaller than 5W.

2. The pixel array substrate of claim 1, wherein the first bottom electrode is electrically connected to the first electrode.

3. A pixel array substrate, comprising:
a substrate;
at least one pixel structure disposed on the substrate, wherein the at least one pixel structure comprises:
a micro light emitting diode, comprising:
a first electrode;
a first semiconductor layer electrically connected to the first electrode;
a second semiconductor layer, wherein at least a part of the second semiconductor layer overlaps the first semiconductor layer;
a light emitting layer disposed between the first semiconductor layer and the second semiconductor layer; and
a second electrode electrically connected to the second semiconductor layer;
a supporting wall disposed on the substrate;
a first bottom electrode disposed on the substrate and between the supporting wall and the micro light emitting diode; and
a first top electrode disposed on the supporting wall and separated from the first bottom electrode; and
a liquid crystal layer disposed on the first bottom electrode and between the supporting wall and the micro light emitting diode, wherein the supporting wall has a first side facing the micro light emitting diode and a second side opposite to the first side, an angle between the first side and the substrate is α1, an angle between the second side and the substrate is α2, and α1 is greater than α2.

4. The pixel array substrate of claim 1, further comprising a first signal line electrically connected to the first top electrode.

5. The pixel array substrate of claim 1, wherein a material of the liquid crystal layer is a blue phase liquid crystal.

6. The pixel array substrate of claim 2, further comprising a second bottom electrode disposed on the substrate and electrically connected to the second electrode.

7. The pixel array substrate of claim 1, wherein the supporting wall and the first top electrode surround four sides of the micro light emitting diode.

8. The pixel array substrate of claim 1, wherein the height of the supporting wall is more than twice the height of the micro light emitting diode.

9. The pixel array substrate of claim 1, wherein the height of the supporting wall is H, and a distance between the first top electrode and the substrate is greater than 2/3H.

10. The pixel array substrate of claim 1, further comprising:
a second top electrode disposed on the supporting wall and separated from the first top electrode; and
a second signal line electrically connected to the second top electrode.

11. The pixel array substrate of claim 10, wherein the at least one pixel structure comprises two adjacent pixel structures, wherein the supporting walls of the two adjacent pixel structures are separated from each other, and the first top electrode of one of the two adjacent pixel structures is adjacent to the second top electrode of the other pixel structure.

12. The pixel array substrate of claim 11, further comprising a light shielding pattern located between the two adjacent pixel structures.

13. The pixel array substrate of claim 12, wherein a vertical projection of the light-shielding pattern on the substrate is located between a vertical projection of the first top electrode of the one of the two adjacent pixel structures on the substrate and a vertical projection of the second top electrode of the other pixel structure on the substrate.

14. A driving method of a pixel array substrate, comprising:
providing a pixel array substrate, comprising:
a substrate;
at least one pixel structure disposed on the substrate, wherein the at least one pixel structure comprises:
a micro light emitting diode, comprising:
a first electrode;
a first semiconductor layer electrically connecting the first electrode;
a second semiconductor layer, wherein at least a part of the second semiconductor layer overlaps the first semiconductor layer;
a light emitting layer disposed between the first semiconductor layer and the second semiconductor layer; and
a second electrode electrically connected to the second semiconductor layer;
a supporting wall disposed on the substrate;
a first bottom electrode disposed on the substrate and between the supporting wall and the micro light emitting diode; and
a first top electrode disposed on the supporting wall and separated from the first bottom electrode; and
a liquid crystal disposed on the first bottom electrode and between the supporting wall and the micro light emitting diode;
applying a first voltage to the first electrode;
applying a second voltage to the first bottom electrode;
applying a third voltage to the second electrode; and
applying a fourth voltage to the first top electrode, wherein the first voltage is different from the third voltage, and the second voltage is different from the fourth voltage.

15. The driving method of claim 14, wherein a material of the liquid crystal layer is a blue phase liquid crystal.

16. The driving method of claim 14, wherein the first bottom electrode is electrically connected to the first electrode, and the first voltage is equal to the second voltage.

17. The driving method of claim 14,
wherein the at least one pixel structure further comprises a second top electrode disposed on the supporting wall and separated from the first top electrode;
the pixel array substrate further comprising a second signal line electrically connected to the second top electrode; and
the driving method further comprises applying a fifth voltage on the second top electrode, wherein the second voltage is different from the fifth voltage.

18. The driving method of claim 17, wherein the fifth voltage is different from the fourth voltage.

* * * * *